United States Patent
Frey et al.

(10) Patent No.: US 6,445,609 B2
(45) Date of Patent: Sep. 3, 2002

(54) INTEGRATED DRAM MEMORY CELL AND DRAM MEMORY

(75) Inventors: Alexander Frey; Werner Weber, both of München; Till Schlösser, Dresden, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/801,715

(22) Filed: Mar. 9, 2001

(30) Foreign Application Priority Data

Mar. 10, 2000 (DE) .......................... 100 11 672

(51) Int. Cl.[7] .............................. G11C 11/94

(52) U.S. Cl. ..................... 365/149; 365/51; 365/63

(58) Field of Search ..................... 365/51, 63, 149

(56) References Cited

U.S. PATENT DOCUMENTS 5,303,252 A * 4/1994 Welsch et al. ................ 372/61
5,817,522 A   10/1998 Goodman et al.

FOREIGN PATENT DOCUMENTS

| DE | 4103105 | 8/1991 |
|---|---|---|
| DE | 19519160 | 9/1996 |

OTHER PUBLICATIONS

English Language Abstract of DE 195 19 160.
English Language Abstract of DE 41 03 105.
Article entitled "A New Stacked Capacitor DRAM Cell Characterized by a Storage Capacitor on a Bit–line Structure". By Kimura et al., IEDM 1988, pp. 596–599.

* cited by examiner

Primary Examiner—A. Zarabian
(74) Attorney, Agent, or Firm—Greenblum & Bernstein, P.L.C.

(57) ABSTRACT

A DRAM memory (50) having a number of DRAM memory cells (51) is described, the memory cells (51) in each case having a storage capacitor (52) and a selection transistor (12) which are formed in the area of an at least essentially rectangular cell area (59), the cell areas (59) having a greater extent in the longitudinal direction (L) than in the width direction (B) and which are wired or can be wired to the cell periphery via a word line (56, 57) and a bit line (55). The word lines (56, 57) and the bit line (55) are conducted over the memory cells (51) and are at least essentially oriented perpendicularly to one another. To achieve, with increasing miniaturization of the DRAM memory patterns, during the transition from so-called "folded" bit line architectures to so-called "open" bit line architectures that the bit line grid, and thus also the grid of corresponding read/write amplifiers, varies linearly in scale with the longitudinal extent (L) of the memory cells (51), it is provided according to the invention that the bit lines (55) are now oriented perpendicularly to the longitudinal extent (L) of the memory cells (51) in the direction of the lateral extent (B) of the memory cells (51)

16 Claims, 5 Drawing Sheets

INTEGRATED DRAM MEMORY CELL AND DRAM MEMORY

The present invention firstly relates to an integrated DRAM memory cell according to the precharacterizing clause of claim 1. The invention also relates to a DRAM memory.

Figure 1:
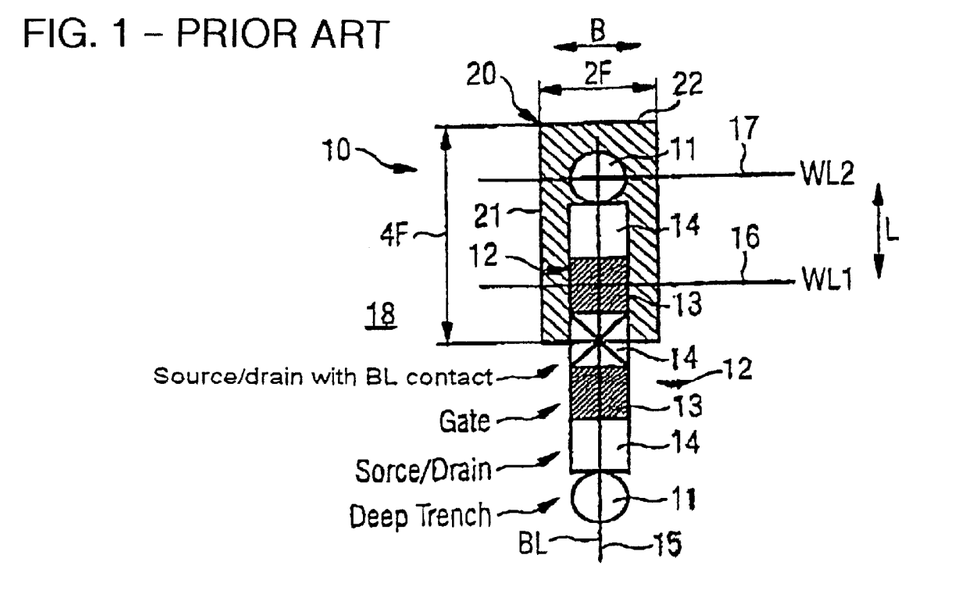
FIG. 1 shows a basic layout of a DRAM memory cell with conventional word line/bit line orientation.

DRAM (Dynamic Random Access Memory) memory cells and memories represent an important type of memory for storing digital information. A DRAM is a memory in which data can be stored after inputting an address and can be read out again under this address. In DRAM memory cells or memories, respectively, the information is not stored as a switching state of a circuit but as a charge quantity in a capacitance. Such a memory cell can thus be formed with only one storage capacitor and one selection transistor. An example of a DRAM memory cell is shown in FIG. 1. Since each capacitor has leakage currents and leakage currents also flow via the selection transistor, the information in the DRAM memory cell is continuously reduced. The information content of the memory cell is therefore lost with time. In order to avoid this, the contents of the memory cells are periodically read out, the memory contents are evaluated and the memory cell is written to again. This means that the charge contents of the storage capacitors are refreshed again.

DRAM memory cells are usually connected together to form memory cell arrays, a DRAM memory having one or more such memory cell arrays. As a rule, only a limited area, which is called cell area and has an essentially rectangular configuration, is available to form the individual memory cell components (storage capacitor and selection transistors. The cell area usually has a greater extent in the longitudinal direction (longitudinal extent) than in the width direction (lateral extent). The individual components of the memory cell or, respectively, of its individual component parts are, as a rule, arranged approximately in a line and at a certain distance from one another behind one another within the boundary of the cell area. The resultant extent of the memory cell and thus also of the cell area is understood to be the longitudinal extent or extent in the longitudinal direction, respectively. The resultant extent of the memory cell in the perpendicular direction thereto, and thus also of the cell area, is understood to be the lateral extent or, respectively, extent in the lateral direction. Each memory cell is wired or can be wired to the cell periphery via a word line and a bit line, the word line and the bit line being conducted over the memory cell and being at least essentially oriented perpendicularly to one another. Such a configuration of the memory cell is shown by way of example in FIG. 1. By activating a certain word line, all memory cells connected to it can be read out, written to or refreshed with respect to their information content via their bit lines.

An essential feature of the DRAM development is the miniaturization of the patterns. On the one hand, the minimum pattern size F to be generated lithographically is reduced in size approximately by a factor of $1/\sqrt{2}$ from generation to generation. On the other hand, the architecture of the memory cell is changed in such a manner that the consumption of area per bit drops.

The bit line wiring of the individual cells establishes a grid into which read/write amplifiers also have to be introduced. The basic task of read/write amplifiers is to evaluate and amplify signals read our of the bit lines.

The area needed for the total wiring per memory cell defines a minimum size for the cell area up to which a reduction in size of the memory cell architecture leads to a saving in area. Dropping below this minimum cell size would mean that the space requirement of such wiring is fixed by the wiring grid and thus independent of the cell size achieved or achievable.

In the so-called "folded" bit line architecture hitherto used as is shown, for example, in FIG. 4 and will be explained in greater detail in the description of the figures, the minimum area needed for the wiring per cell is $8\ F^2$. This can also be seen, for example, in FIG. 2. In the "folded" bit line concept, the individual bit lines are in each case arranged next to one another. This requires two bit lines in each case, namely a bit line BL to be evaluated and a reference bit line BBL. The reference bit line BBL has the task of comparing a signal read out of the bit line or, respectively, memory cell to be evaluated, with a reference value. This will be explained by means of a brief example.

In the DRAM memory cells, digital information can be stored, for example, in the form of logical "0" and "1". To each of these logical information items, a certain voltage value is allocated. For example, the voltage value for a logical "0" can be zero volts, whereas the voltage value for a logical "1" is, for example, 2 volts. Before the memory cell is read out, a reference voltage is applied to all bit lines, for example a voltage of 1 volt. When the memory cell is read out, the voltage value will either increase or decrease, depending on the information content of the memory cell. This change in voltage is compared with the reference voltage of 1 volt which is still present in the reference bit line. If the voltage value in the bit line to be evaluated is higher than the reference voltage value, the information content logical "1" was written in the memory cell. If the voltage values are smaller, the information logical "0" was written in the memory cell. The voltage signal read out of the bit line to be evaluated and of the reference bit line is conditioned and processed further, for example amplified in the read/write amplifier.

Figure 2:
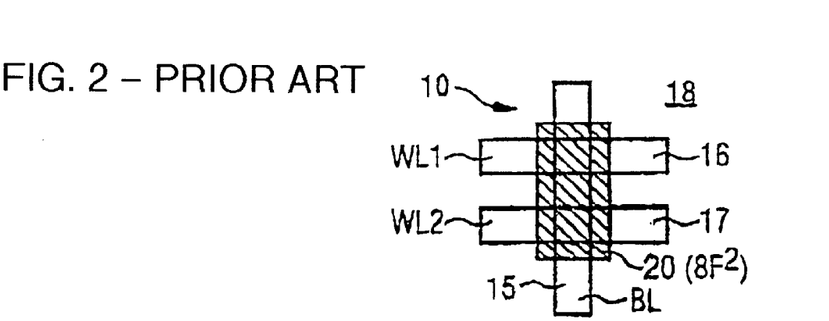
FIG. 2 shows in a diagrammatic view the minimum space requirement of a DRAM memory cell having two word lines for the word line and bit line wiring.

In the "folded" bit line concept, two word lines WL are conducted over each memory cell. One word line activates the selected cell whilst leaving the neighbouring cells, and thus the neighbouring bit line, deactivated. The second word line only passes the cell to be read out and activates the neighbouring cells when selected. A wiring architecture comprising one bit line BL and two word lines WL conducted in parallel over the memory cell needs an area of at least $8\ F^2$ as shown in FIG. 2. The "folded" bit line concept is thus only appropriate for cells $\geq 8\ F^2$.

Above the 4-Gbit generation, the architecture of the DRAM memory cell requires an area consumption of less than $8\ F^2$. The wiring must then be changed in such a manner that it does not determine the space requirement of the cell array. This is achieved by conducting only a single word line over each cell. This is shown, for example, in FIG. 3. As can be seen from this figure, the minimum space requirement for the wiring drops to $4\ F^2$. The consequence for the bit line architecture is a transition from the "folded" to the so-called "open" bit line concept. Such an "open" concept is shown, for example, in FIG. 5 and will be explained in greater detail in the description of the figures. As can be seen from FIG. 5, the grid of the read/write amplifier SA is reduced from 8 F to 4 F with a conventional word line and bit line arrangement, independently of the size of the memory cell. The grid is reduced abruptly which means that this grid is required for each cell which is $<8\ F^2$ regardless of whether it is a $7\ F^2$, $6\ F^2$, $4\ F^2$ cell or the like.

Figure 4:
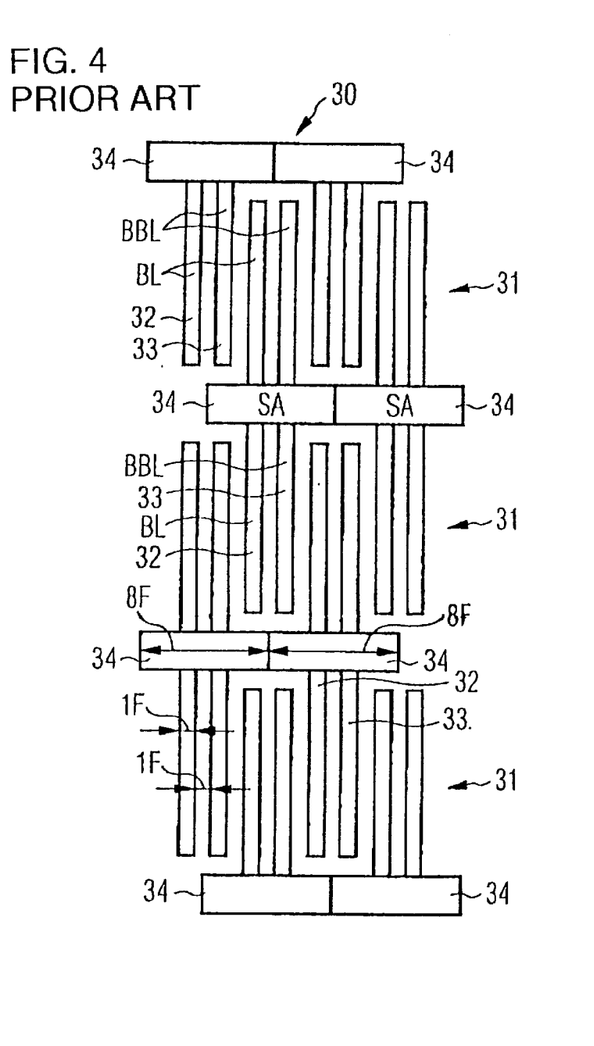
FIG. 4 shows in a diagrammatic view a known "folded" bit line architecture.
Figure 5:
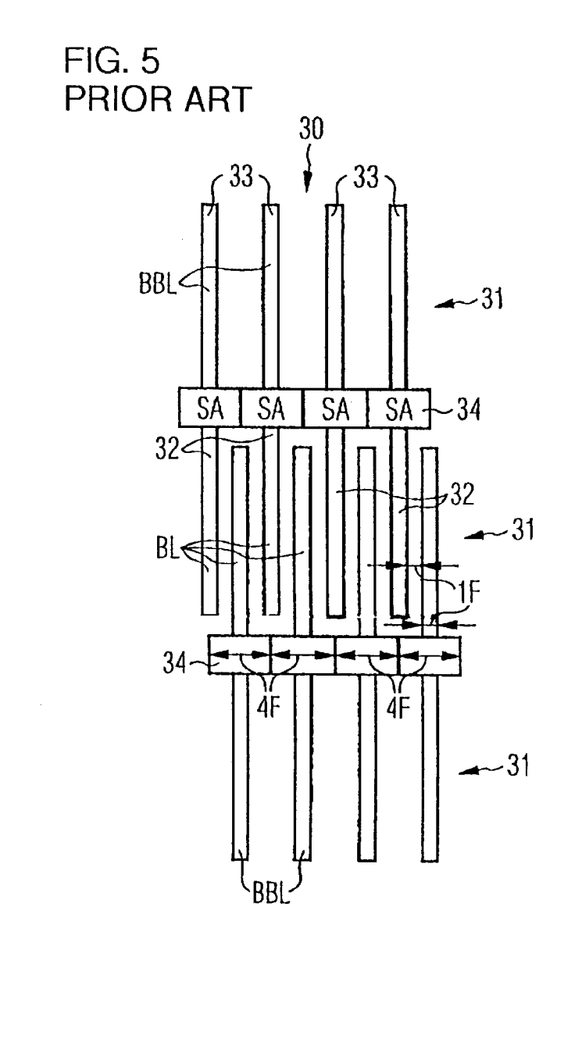
FIG. 5 shows in a diagrammatic view a known "open" bit line architecture.

As can be seen from FIGS. 4 and 5, the grid of the read/write amplifier (SA grid) is determined by, among other things, the width of the bit line BL, the distance between the bit lines and by the arrangement of bit line BL and reference bit line BBL.

For cells <8 F², only a single word line WL can be supplied per cell. As a consequence of this, the neighbouring cells are also read out and the neighbouring bit line cannot be used as reference bit line as was possible in the "folded" bit line concept shown in FIG. 4. Instead, a bit line BBL from a neighbouring cell array is used as reference bit line. This results in the "open" bit line concept and the SA grid is abruptly reduced from 8 F to 4 F independently of the cell size.

In conventional bit line architectures, the distance between adjacent bit lines results from the orientation of the bit line in the direction of the longitudinal extent of the cell as can be seen, for example, in FIG. 1. The distance between two adjacent bit lines is thus fixed by the width of the memory cell. The width of the memory cell, in turn, corresponds to the minimum possible value of 2 F which results from 1 F pattern width of the memory cell components and 1 F distance from the adjacent memory cells.

Along the way to the so-called "trench cells" with architectures of <8 F², the distance between deep trench and gate is reduced. A deep-trench capacitor is a cylindrical capacitor which is aligned perpendicularly to the surface of the substrate in an integrated circuit. The gate is, for example, the gate of the selection transistor. If the distance between the storage capacitor and gate is reduced, the storage cell is correspondingly reduced in size in the longitudinal direction which can be seen, for example, in FIG. 1. Since the bit line is aligned or oriented in the longitudinal direction of the memory cell, the bit line distance between adjacent bit lines therefore remains constant independently of a reduction in size of the cells.

The abrupt reduction of the bit line grid and thus of the read/write amplifier grid from 8 F to 4 F presents problems, especially in the "open" bit line architectures. The reason for this is, among other things, that the layout of the read/write amplifier in the grid, reduced to one half, with planar transistors from which it is built up, is very difficult.

It is, therefore, the object of the present invention to provide a DRAM memory cell and a DRAM memory having a corresponding DRAM memory cell wiring in which the disadvantages described are avoided. In particular, it should be made possible to miniaturize memory patterns in transition from the "folded" to the "open" concept without abruptly reducing the grid of the read/write amplifiers by a considerable degree in the manner described above.

According to the first aspect of the present invention, this object is achieved by an integrated DRAM memory cell comprising a storage capacitor and a selection capacitor which are formed in the area of an at least essentially rectangular cell area, the cell area having a greater extent in the longitudinal direction than in the width direction and which is wired or can be wired to the cell periphery via a word line and a bit line, the word line and the bit line being conducted over the memory cell and being at least essentially oriented perpendicularly to one another. According to the invention, the DRAM memory cell is characterized in that the bit line is oriented perpendicularly to the longitudinal extent of the memory cell in the direction of the lateral extent of the memory cell.

In this manner, a bit line architecture is created by means of which an unstressed read/write amplifier grid for DRAM memory cells of <8 F² can be achieved.

The fundamental idea for solving the problem described above (the severe abrupt reduction of the read-write amplifier grid from 8 F to 4 F on transition from "folded" to "open" bit line concept) consists in arranging the bit line perpendicularly to the longitudinal direction of the cell. The bit line grid resulting from the combination of individual DRAM memory cells to form a DRAM memory, and thus also the read/write amplifier grid, now becomes a function of the longitudinal extent of the memory cell. This is explained in greater detail below with regard to the DRAM memory according to the invention. In addition to the advantages, effects and operation of the DRAM memory cell according to the invention, reference is, therefore, also made to the full content of the subsequent explanations relating to the DRAM memory according to the invention. The read/write amplifier grid scale now changes linearly with the longitudinal extent of the memory cell. As a result, the layout problem of the read/write amplifiers which has hitherto existed and is described above can be reduced.

Advantageous embodiments of the DRAM memory cell according to the invention are obtained from the subclaims.

The DRAM memory cell can advantageously have a cell area of <8 F². By means of the present invention, 7 F² cells, 6 F² cells and the like can be preferably achieved.

The bit line and/or the word line can advantageously have a width of 1 F.

The width of the memory cell is preferably 2 F whilst the memory cell preferably has a cell length of <4 F.

According to the second aspect of the present invention, a DRAM memory is provided which has a number of DRAM memory cells according to the invention as described above. The memory cells in each case form one or more memory cell arrays, in each case a number of memory cells of a memory cell array being connected to a common word line and a common bit line, the word lines forming a word line grid and the bit lines forming a bit line grid.

In addition to the advantages, effects and operation of the DRAM memory according to the invention, reference is also made to the full content of the above explanations relating to the DRAM memory cell according to the invention.

The individual bit lines of each cell are now oriented perpendicularly to the longitudinal alignment of the memory cell, i.e. perpendicularly to its longitudinal extent and parallel to its lateral extent. If then the length of the memory cells is reduced, for instance by reducing the distance between the gates of the selection transistors and the storage capacitors, this reduction in distance also becomes noticeable in the distance between adjacent bit lines so that these move closer to each other to the degree of the shortening of the memory cell. In this process, the degree of reduction in distance is flowing, however, and not abrupt as in the transition from the conventional "folded" to the conventional "open" bit line architecture explained in the introduction to the description.

Advantageous embodiments of the DRAM memory according to the invention are obtained from the subclaims.

The DRAM memory can advantageously have an "open" pattern. Such a pattern takes into account the continuing miniaturization of the DRAM memories in the manner described above.

In this context, a bit line from another memory cell array can be used as reference bit line for the bit line of a memory cell to be read out.

The bit line grid is advantageously formed as a function of the longitudinal extent of the memory cells. This has the abovementioned advantages.

Apart from the components described before, the DRAM memory has, as a rule, one or more read/write amplifiers which, for evaluation and further processing of the signals transmitted via the bit lines, is/are wired to the latter. A read/write amplifier has the task of amplifying the signals passing via the bit lines which usually only have very small signal values, to the signal values required in each case for further usage steps.

The read/write amplifiers are preferably arranged in a grid corresponding to the bit line grid so that the grid of the read/write amplifiers varies linearly in scale with the longitudinal extent of the memory cells. This is illustrated, for example, by the following formula which is:

$$SA \text{ grid} = 2 \cdot BL \text{ grid} = 2 \cdot \frac{\text{cell size}}{2F} = \frac{\text{cell size}}{F}$$

where SA grid=read/write amplifier grid, BL grid=bit line grid and F=minimum lithographic pattern size.

In each case a number of gates, in particular four gates, of adjacent memory cells can be advantageously connected to one another in the manner of islands via a word line.

In this manner, a particularly advantageous arrangement of the word lines, the totality of which forms a word line grid, can be implemented perpendicularly to the bit lines or, respectively, the bit line grid. The gates are, for example, gates of the selection transistors provided in each memory cell.

This word line can be advantageously formed as polysilicon line.

These word lines which in each case connect adjacent memory cells to one another in the manner of islands are, in turn, connected to a further metal word line at certain intervals so that the individual islands, especially the polysilicon islands, are connected to one another via the metal word lines in the individual memory cells.

The two word lines in the DRAM memory are preferably arranged above one another.

To ensure that in each case only one memory cell is read out on to each bit line, two metal word lines running next to one another can alternately in each case contact memory cell gates of different types. An example of this is shown with regard to FIG. 6.

To implement the islands, the word lines connecting adjacent memory cells in the manner of islands must be conducted over the respective source-drain region of the memory cell(s) which connects the storage capacitor, for example the deep-trench capacitor, to the selection transistor.

In the text which follows, a possible production variant is described for this. The isolation required when conducting the word lines over the source-drain regions can be implemented, for Example, via a so-called STI (Shallow Trench Isolation) process which, however, requires an additional photolithographic plane. The STI method is a trench isolation method in which adjacent transistors or other active regions of an integrated circuit are laterally isolated by trenches, the trenches being etched into monocrystalline silicon and being filled with insulating material, To produce the abovementioned pattern, for example, first the gate of the selection transistor can be produced, for example via a suitable gate-oxide and gate-poly and gate-nitride deposition. After that, the gate is patterned. This is followed by the STI etching and the subsequent filling of the etched areas with oxide. The pattern can then be polished by means of a suitable CMP (Chemical Mechanical Polishing) method. The island-like connection of gates of adjacent memory cells is then produced via a word line, for example a polysilicon word line, in that the individual polysilicon islands are deposited at the required places and patterned via an additional photolithographic plane.

In summary, the DRAM memory cell according to the invention and the DRAM memory according to the invention and the resultant new memory cell and bit line architecture exhibit a number of advantages. For example, the read/write amplifier grid which varies in scale linearly with the longitudinal extent of the cells can be mentioned firstly. This also enlarges the bit line grid at the same time. This leads to a reduction in the disadvantageous coupling capacitances between adjacent bit lines which increase inversely to the distance between adjacent bit lines. To keep the resistance of the word lines low, the word line connecting the individual gates in the manner of islands, for example the polysilicon line, is contacted by a metal word line at certain intervals. In the area of these contacts, the distance between the bit lines must be correspondingly enlarged. These contacts can be made without additional space requirement in the bit line architecture resulting from the invention. The frequency of contacting is much greater than in conventional bit line architectures. This thus reduces the word line resistance.

The invention will now be explained in greater detail by means of illustrative embodiments and referring to the attached drawing, in which.

FIG. 1 diagrammatically shows the structure of a DRAM memory cell 10. In the present illustrative embodiment, this is a so-called dual-trench cell. The DRAM memory cell 10 has two cell components formed in the same manner.

The DRAM memory cell 10 has two storage capacitors 11 which are formed as so-called deep-trench capacitors in the present case. Furthermore, a total of two selection transistors 12 are provided which in each case have corresponding gates 13 and source-drain regions 14. Since it is a dual-trench cell in the present case, the source-drain region 14 which is contacted by a bit line 15 is used jointly by both cell parts.

The individual components of the memory cell 10 are formed in the area of an at least essentially rectangular cell area 20, the cell area 20 having a greater extent in the longitudinal direction L than in the width direction B. The individual components of the memory cell 10, that is to say the storage capacitor 11 and the selection transistor 12, have a minimum pattern width of 1 F, F standing for the minimum lithographic pattern size. Furthermore, each memory cell 10 has a distance of 1 F to the in each case adjacent cells so that a cell width 22 of 2 F in total is obtained in the present illustrative embodiment. The cell length 21 is determined in a similar manner so that it is obtained as 4 F in the present case. The cell area 20 of the cell part of memory cell 10 is thus obtained as 8 $F^2$.

Each cell part of the memory cell 10 is wired or can be wired to the cell periphery 18 via a word line 16, 17 and a bit line 15. The word lines 16, 17 and the bit line 15 are conducted over the memory cell 10 and are at least essentially oriented perpendicularly to one another.

The memory cell 10 is a type known from the prior art in which the bit line 15 is oriented in the longitudinal direction L of the memory cell 10, that is to say parallel to the longitudinal extent 21 of the memory cell 10.

The memory cell 10 shown in FIG. 1 is also shown in FIG. 2 in a greatly simplified form. Using the type of memory cell shown in FIG. 2, DRAM memories 30 with so-called "folded" bit line architecture can be achieved. Such a DRAM memory 30 known from the prior art with "folded" bit line architecture is shown in FIG. 4.

In the "folded" bit line concept according to FIG. 4, the bit lines (BL) 32 and corresponding reference bit lines (BBL) 33 are in each case arranged adjacently to one another. The operation of such a DRAM memory 30 has been explained in detail in the introduction to the description so that another description is omitted at this place. Such a "folded" concept requires that two word lines (WL) 16, 17 are conducted over each memory cell 10 as can be seen in FIG. 2. A word line 16 activates the selected memory cell 10 whilst leaving the adjacent cells, and thus adjacent bit lines, deactivated. The second word line 17 only passes the memory cell 10 to be read out and activates the adjacent cells when selected. The wiring of the DRAM memory cells 10 with one bit line (BL) 15 and two word lines (WL1, WL2) 16, 17 needs at least a cell area of 8 $F^2$ (as shown in FIG. 2) and is, therefore, only appropriate for cells of $\geq 8$ $F^2$.

Figure 3:
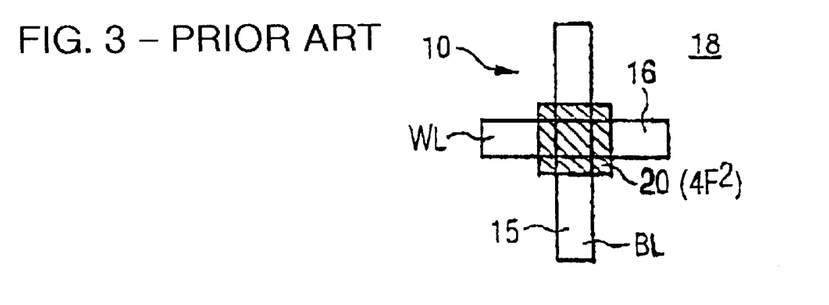
FIG. 3 shows in a diagrammatic view the minimum space requirement for a DRAM memory cell for the word line and bit line wiring when using only one word line.

With increasing miniaturization of the patterns and thus of the DRAM memory 30, however, an area consumption of less than 8 $F^2$ is increasingly required for the cell areas 20 of the memory cells 10. The wiring must then be changed in such a manner that it does not determine the space requirement of a memory cell array 31. This is achieved by conducting only one word line (WL) 16 over each memory cell 10. As shown in FIG. 3, the minimum space requirement for the wiring then drops to 4 $F^2$. As a result, the consequence for the bit line architecture is the transition from the "folded" concept (see FIG. 4) to the "open" concept as shown in FIG. 5.

FIG. 5 shows a DRAM memory 30, known from the prior art and having such an "open" concept. As has already been mentioned, only a single word line 16 can be supplied for memory cells 10 having a cell area 20 of <8 $F^2$ per memory cell. As a consequence of this, the neighbouring cells are always also read out and the neighbouring bit line (BBL) 33 to the bit line BL (32) to be read out cannot be used as reference bit line as was possible in the "folded" concept according to FIG. 4. Instead, a bit line from an adjacent memory cell array 31 is used as reference bit line (BBL) 33. This reduces the grid of the read/write amplifiers 34 also provided in the DRAM memory 30. In the conventional arrangement of the word lines 16 and bit lines 15 (see also FIG. 3) shown in FIG. 5, this grid of the read/write amplifiers (SA) 34 is reduced from 8 F to 4 F independently of the actual size of the memory cell 10. However, the layout of the read/write amplifiers 34 in the grid reduced to one half is still very problematic with the planar transistors normally used for constructing read/write amplifiers.

Figure 6:
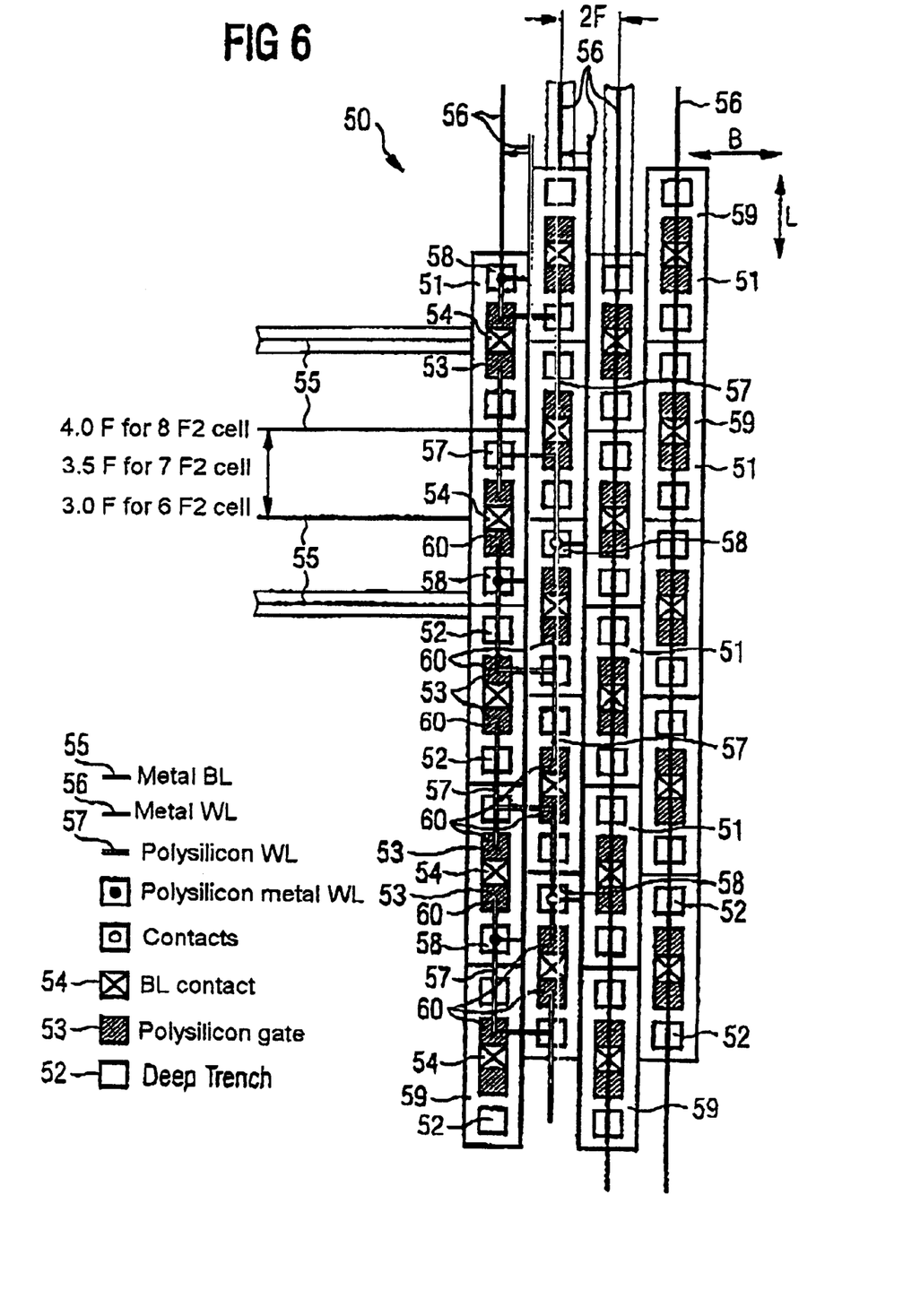
FIG. 6 shows in a diagrammatic view an illustrative embodiment of a DRAM memory according to the invention shown in parts.
Figure 7:
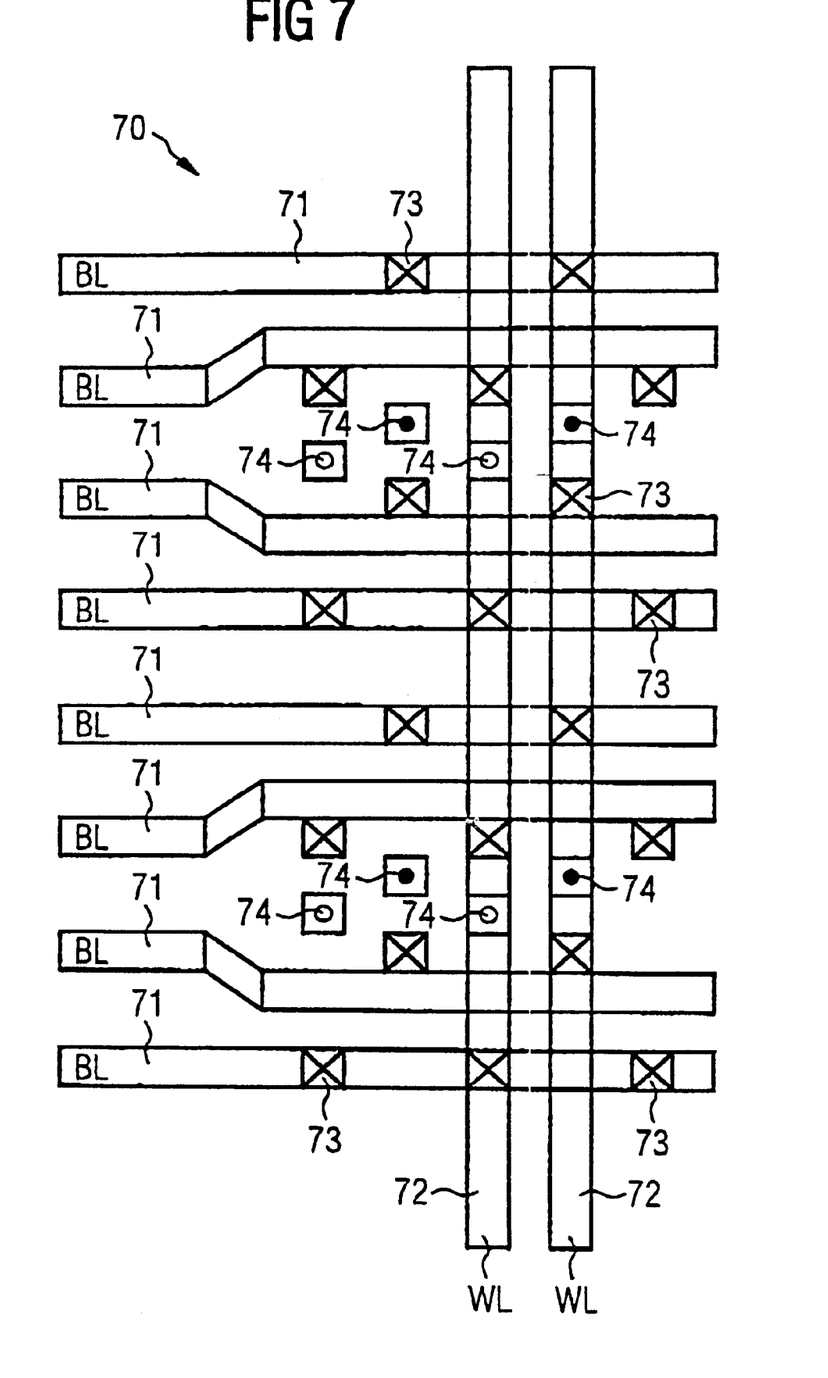
FIG. 7 shows an advantageous variant of the layout for a DRAM memory according to the invention having 6 $F^2$ memory cells.
Figure 8:
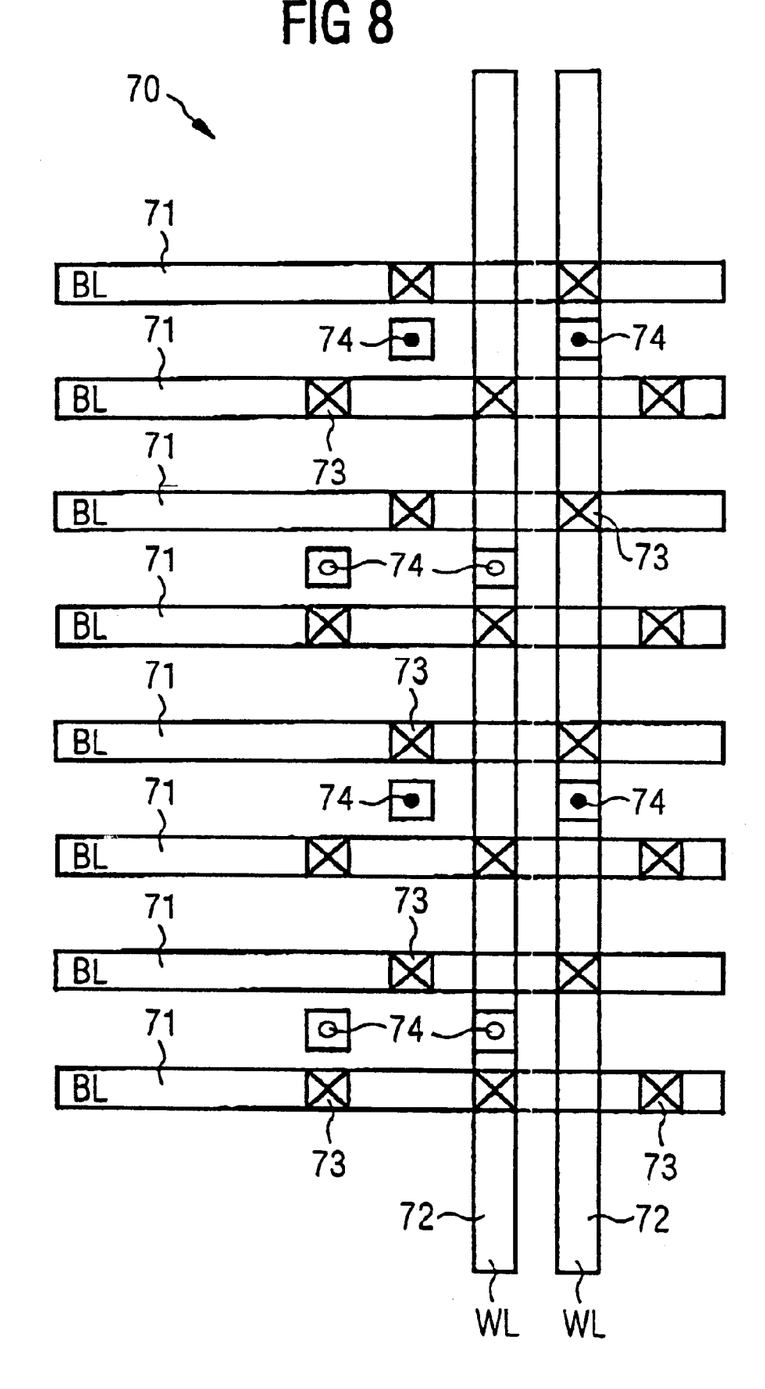
FIG. 8 shows another variant of the layout for a DRAM memory according to the invention having 6 $F^2$ memory cells.

One possibility of circumventing these problems is shown in connection with FIGS. 6 to 8.

FIG. 6 shows a DRAM memory 50 according to the invention which has a number of DRAM memory cells 51. The individual DRAM memory cells 51 can have (as shown in connection with the memory cell 10 in FIG. 1) in each case one storage capacitor 52 which can be constructed as deep-trench capacitor and one selection transistor. The individual components are in each case formed in the area of a cell area 59. Each selection transistor has a number of gates 53. In the source-drain region of the selection transistor, a contact 54 with a bit line 55 is provided.

In contrast to the solutions shown in FIGS. 1 to 5, the bit line 55 is now no longer oriented in the longitudinal direction L of the memory cell (see FIG. 1). Instead, the bit line 55 is oriented perpendicularly to the longitudinal extent of the memory cell 51 in the direction of the lateral extent of the memory cell 51 (see also the illustration in FIG. 1 for comparison). This makes it possible for the bit line grid, and thus also the read/write amplifier grid now to become a function of the longitudinal extent of the memory cell 51. As a result, the read/write amplifier grid now varies linearly in scale with the length of the memory cells.

If the distance between the deep-trench capacitor 52 and the gate 53 of the selection transistor is shortened, for example, which also shortens the longitudinal extent of the memory cell 51, the grid of the read/write amplifiers can also be reduced in size "flowingly" in the same manner without resulting in the abrupt reductions in size of the grids from 8 F to 4 F known from the prior art and the resultant disadvantages and problems.

Since the bit lines 55 are now conducted over the memory cells 51 perpendicularly to the longitudinal extent of the memory cell 51, the word lines 56, 57 conducted over the memory cells 51 now have an orientation in the longitudinal direction L of the memory cell 51, that is to say parallel with the longitudinal extent of the memory cell 51.

To achieve a particularly advantageous arrangement of the word lines 56, 57 perpendicularly to the bit lines 55, it is proposed, in accordance with the illustrative embodiment in FIG. 6, that individual gates of adjacent memory cells are in each case connected to one another in the manner of islands by a word line 57, this word line 57 being constructed as polysilicon line in the present case. The gates of the selection transistors which are connected to the polysilicon word line 57 are designated by the reference number 60 in the illustrative embodiment according to FIG. 6. For the sake of better clarity, the polysilicon word line 57 is shown as a "double line".

In the illustrative embodiment according to FIG. 6, four gates 60 of adjacent memory cells 51 are in each case connected to one another in the manner of islands by polysilicon word lines 57. The individual polysilicon islands, in turn, are connected to one another by a metal word line 56. The word lines 56 are preferably arranged directly above the polysilicon word line 57. The course of the metal word lines 56 results, for example, from the two right-hand rows of DRAM memory cells 51 in FIG. 6. To be able to illustrate more clearly the course of the polysilicon word lines 57, the metal word lines 56 are shown offset in the two left-hand rows of memory cells 51. The small arrow at the top of the drawing illustrates, however, that these metal word lines 56 shown offset actually run directly over the polysilicon word lines 57.

The polysilicon word lines 57 are connected to the metal word line 56 at certain intervals via corresponding contacts 58.

To ensure that only one memory cell 51 is read out onto each bit line 55, two metal word lines 56 running adjacently to one another alternately in each case contact on islands 60 of different types. To implement the islands 60, the polysilicon traces 57 must run over the source-drain region which connects the deep-trench storage capacitor 52 to the selection transistor. The isolation necessary for this can be achieved by a modified "raised STI" process, in which, however, an additional photolithographic plane is necessary.

FIGS. 7 and 8, finally, show two illustrative embodiments for a DRAM memory layout 70 which have a correspondingly optimized architecture of the bit lines 71. Both DRAM memories 70 have a number of memory cells which are formed as 6 $F^2$ memory cells. The contacts 73 between the bit lines 71 and the DRAM memory cells are shown by crossed boxes. The contacts 74 between the metal word line 72 and the respective polysilicon islands are shown as squares with a circle.

In the layout example shown in FIG. 7, the bit lines 71 are run in such a manner that at least a distance of 1 F is in each case maintained between the individual elements. The consequence is that some of the bit lines 71 have offsets. If the distance between the bit lines 71 and the contacts 74 is reduced to ½ F as shown in FIG. 8, the bit lines 71 can be run straight over the memory cell array of the DRAM memory with identical grid.

The present disclosure relates to subject matter contained in priority German Patent Application No. 100 11 672.3, filed on Mar. 10, 2000, the contents of which is herein expressly incorporated by reference in its entirety.

What is claimed is:

1. A DRAM memory having a plurality of memory cells that form at least one memory cell field, each memory cell of said plurality of memory cells being connected with a word line and a bit line, said memory cell comprising:

a memory capacitor; and a selection transistor that includes a gate, said memory capacitor and said selection transistor being formed in a region of an essentially rectangular cell area that is larger in a longitudinal direction in comparison with a width direction, word lines and bit lines of said plurality of memory cells being guided over each respective memory cell, said bit line being oriented substantially perpendicular to a longitudinal extension of said respective memory cell in a direction of a width extension of said memory cell, said work lines forming a first word line and a second word line, a plurality of gates of neighboring memory cells being connected over a respective first word line in a form of an island, said first word line being connected with a corresponding second overlying word line in a predetermined distance, said second word line being oriented substantially parallel to said longitudinal extension of said memory cell.

2. The DRAM memory of claim 1, wherein said plurality of gates comprise four gates.

3. The DRAM memory of claim 1, wherein said cell area is less than approximately 8 $F^2$, where F represents a predetermined lithographic pattern size.

4. The DRAM memory claim 1, wherein at least one of said bit line and said word line has a width of approximately 1 F, where F represents a predetermined lithographic pattern size.

5. The DRAM memory of claim 1, wherein each memory cell has a cell width of approximately 2 F, where F represents is a predetermined lithographic pattern size.

6. The DRAM memory of claim 1, wherein said memory cell has a cell length less than approximately 4 F, where F represents a predetermined lithographic pattern size.

7. The DRAM memory of claim 1, wherein a bit line from one memory cell is used as a reference bit line for another memory cell.

8. The DRAM memory of claim 1, further comprising:

a plurality of read/write amplifiers arranged in a grid corresponding to a bit line grid, such that said grid of said read/write amplifiers varies linearly in scale with a longitudinal extent of said memory cells.

9. The DRAM memory of claim 1, wherein each word line is formed as a polysilicon line.

10. The DRAM memory of claim 1, wherein each word line is connected to a metal word line at predetermined intervals.

11. The DRAM memory of claim 10, wherein one word line is arranged above another word line.

12. A DRAM memory, comprising:

a plurality of memory capacitors; and a plurality of selection transistors, a memory capacitor and an associated selection transistor forming a memory cell in a predetermined region of an essentially rectanuglar cell area that is larger in a longitudinal direction in comparison with a width direction, a bit line running substantially perpendicular to a longitudinal extension of said respective memory cell, a first word line and a second word line being oriented substantially parallel to said longitudinal extension of said respective memory cell.

13. The DRAM memory of claim 12, wherein said cell area is less than approximately 8 $F^2$, where F represents a predetermined lithographic pattern size.

14. The DRAM memory claim 12, wherein at least one of said bit line, said first word line and said second word line has a width of approximately 1 F, where F represents a predetermined lithographic pattern size.

15. The DRAM memory of claim 12, wherein each memory cell has a cell width of approximately 2 F, where F represents a predetermined lithographic pattern size.

16. The DRAM memory of claim 1, wherein said memory cell has a cell length less than approximately 4 F, where F represents a predetermined lithographic pattern size.

* * * * *